(12) United States Patent
Babcock et al.

(10) Patent No.: US 8,247,300 B2
(45) Date of Patent: Aug. 21, 2012

(54) CONTROL OF DOPANT DIFFUSION FROM BURIED LAYERS IN BIPOLAR INTEGRATED CIRCUITS

(75) Inventors: Jeffrey A. Babcock, Richardson, TX (US); Angelo Pinto, San Diego, CA (US); Manfred Schiekofer, Freising (DE); Scott G. Balster, Munich (DE); Gregory E. Howard, Dallas, TX (US); Alfred Hausler, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 132 days.

(21) Appl. No.: 12/627,794

(22) Filed: Nov. 30, 2009

(65) Prior Publication Data
US 2010/0279481 A1    Nov. 4, 2010

Related U.S. Application Data

(60) Continuation of application No. 11/180,457, filed on Jul. 13, 2005, now abandoned, which is a division of application No. 10/284,007, filed on Oct. 30, 2002, now abandoned.

(60) Provisional application No. 60/334,851, filed on Oct. 31, 2001.

(51) Int. Cl.
*H01L 21/8222* (2006.01)
(52) U.S. Cl. ........ 438/309; 438/313; 438/322; 438/340; 257/E27.055
(58) Field of Classification Search .......... 438/309–340; 257/E27.055
See application file for complete search history.

(56) References Cited

U.S. PATENT DOCUMENTS

| 6,316,795 B1 | 11/2001 | Croke, III |
| 6,362,037 B1 | 3/2002 | Yoshihara et al. |

(Continued)

FOREIGN PATENT DOCUMENTS

EP    0419 256 A1    3/1991

OTHER PUBLICATIONS

Onai et al., "An NPN 30 GHz PNP 32 GHz fT Complementary Bipolar Technology", IEDM (IEEE,1993) pp. 63-66.

(Continued)

*Primary Examiner* — H. Jey Tsai
(74) *Attorney, Agent, or Firm* — Alan A. R. Cooper; Warren L. Franz; Frederick J. Telecky, Jr.

(57) ABSTRACT

An integrated circuit and method of fabricating the integrated circuit is disclosed. The integrated circuit includes vertical bipolar transistors (30, 50, 60), each having a buried collector region (26'). A carbon-bearing diffusion barrier (28c) is disposed over the buried collector region (26'), to inhibit the diffusion of dopant from the buried collector region (26') into the overlying epitaxial layer (28). The diffusion barrier (28c) may be formed by incorporating a carbon source into the epitaxial formation of the overlying layer (28), or by ion implantation. In the case of ion implantation of carbon or SiGeC, masks (52, 62) may be used to define the locations of the buried collector regions (26') that are to receive the carbon; for example, portions underlying eventual collector contacts (33, 44c) may be masked from the carbon implant so that dopant from the buried collector region (26') can diffuse upward to meet the contact (33). MOS transistors (70, 80) including the diffusion barrier (28) are also disclosed.

4 Claims, 10 Drawing Sheets

U.S. PATENT DOCUMENTS

| | | | |
|---|---|---|---|
| 6,461,925 | B1 | 10/2002 | John et al. |
| 2002/0151153 | A1* | 10/2002 | Drobny et al. ............... 438/492 |
| 2002/0177253 | A1 | 11/2002 | Johnson et al. |
| 2002/0185708 | A1 | 12/2002 | Coolbaugh et al. |
| 2003/0173580 | A1 | 9/2003 | Coolbaugh et al. |

OTHER PUBLICATIONS

Warnock, "Silicon Bipolar Device Structures for Digital Applications: Technology Trends and Future Directions", IEEE Transactions on Electron Devices, vol. 42, No. 3, (Mar. 1985), pp. 377-389.

Osten et al., "Carbon Doped SiGe Heterojunction Bipolar Transistors for High Frequency Applications", IEEE BCTM 7.1, (Apr. 1999), pp. 109-116.

Rucker et al., Dopant Diffusion in C-doped Si and SiGe: Physical Model and "Experimental Verification", IEDM (IEEE, 1999) pp. 345-348.

Ban et al., "Suppression of Oxidation-Enhanced Boron Diffusion in Silicon by Carbon Implantation and Characterization of MOSFET's with Carbon-Implanted Channels", IEEE Transactions on Electron Devices, vol. 44, No. 9 (Sep. 1997), pp. 1544-1551.

Yu et al., "Gate Engineering for Deep-Submicron CMOS Transistors", IEEE Transactions on Electron Devices, vol. 45, No. 6 (Jun. 1998), pp. 1253-1262.

King et al., "Electrical Properties of Heavily Doped Polycrystalline Silicon-Germanium Films", IEEE Transactions on Electron Devices, vol. 41, No. 2 (Feb. 1994), pp. 228-232.

El-Kareh, "Fundamentals of Semiconductor Processing Technologies" (Kluwer Academic Publishers, 1995, 1998) pp. 123-134.

Suzuki et al., "Effect of Si-Ge buffer layer for low-temperature Si epitaxial growth on Si Substrate by rf plasma chemical vapor deposition", J. Appl. Phys. vol. 54, No. 3, (1983), pp. 1466-1470.

Bravman et al., "Structure and Morphology of Polycrystalline Silicon-Single Crystal Silicon Interfaces", J. Appl. Phys., vol. 57, No. 8, (Apr. 1985), pp. 2779-2782.

Simoen et al., "Impact of Polysilicon Emitter Interfacial Layer Engineering on the 1/f Noise of Bipolar Transistors", IEEE Transactions on Electron Devices, vol. 43, No. 12, (Dec. 1996), pp. 2261-2268.

Jouan et al., "In-Situ Arsenic Doped Single-Crystal Emitters for Low 1/f Noise Self-Aligned SiGe HBTs". Proceedings of the 29th European Solid-State Device Research Conference, (1999), pp. 336-339.

Ng et al., "Asymmetry in the SiO2 Tunneling Barriers to Electrons and Holes", J. Appl. Phys., vol. 51, No. 4, (Apr. 1980), pp. 2153-2157.

Pankove et al., "Hydrogen Localization Near Boron in Silicon", Appl. Phys. Let., vol. 46, No. 4, (1985), pp. 421-423.

Dunkley et al., "Hot Electron Induced Hydrogen Compensation of Boron Doped Silicon Resulting from Emitter-Based Breakdown", IEDM (IEEE, 1992), pp. 785-788.

Gopi et al., "New Degradation Mechanism Associated with Hydrogen in Bipolar Transistors Under Hot Carrier Stress", Appl. Phys. Lett., vol. 63, No. 9, (Aug. 1993), pp. 1237-1239.

Quon et al., "Hot Carrier Induced Bipolar Transistor Degradation Due to base Dopant Compensation by Hydrogen: Theory and Experiment", IEEE Transaction on Electron Devices, vol. 41, No. 10, (Oct. 1994), pp. 1824-1830.

Zhao et al., "On the Effects of Hydrogen in p-n-p Transistors under Forward Current Stress in a C-BiCMOS Technology", IEEE Electron Device Letters, vol. 14, No. 1, (Jan. 1993), pp. 4-6.

Salm et al., "Diffusion and Electrical Properties of Boron and Arsenic Doped Poly-Si and Poly GexSi1-x (x~0.3) as Gate Material for Sub-0.25 um Complementary Metal Oxide Semiconductor Applications", J. Electrochem. Soc., vol. 144, No. 10, (Oct. 1997), pp. 3665-3673.

* cited by examiner

CONTROL OF DOPANT DIFFUSION FROM BURIED LAYERS IN BIPOLAR INTEGRATED CIRCUITS

CROSS-REFERENCE TO RELATED APPLICATIONS

This is a continuation of application Ser. No. 11/180,457 filed Jul. 13, 2005; which is a division of application Ser. No. 10/284,007 filed Oct. 30, 2002, abandoned; which is a non-provisional of application Ser. No. 60/334,851 filed Oct. 31, 2001; the entireties of both of which are incorporated herein by reference.

STATEMENT REGARDING FEDERALLY SPONSORED RESEARCH OR DEVELOPMENT

Not applicable.

BACKGROUND OF THE INVENTION

This invention is in the field of semiconductor integrated circuits, and is more specifically directed to the formation of buried doped layers in bipolar transistors in such circuits.

Modern bipolar integrated circuits now typically use vertical bipolar transistors as their active elements. These transistors are vertical in the sense that the active base and emitter regions overlie the collector region, with collector-emitter current traveling through the base in substantially a vertical orientation relative to the plane of the surface of the integrated circuit at which the transistor resides. To provide a robust breakdown voltage, the portion of the collector region adjacent the base is relatively lightly doped. This region is often referred to as the "subcollector". These lightly-doped subcollectors are relatively resistive, however. Therefore, many modern bipolar structures reduce the effective collector resistance by providing a heavily-doped buried collector layer underlying the subcollector. This buried collector layer provides a relatively low resistance path for collector current between the active region of the transistor and a collector contact located away from the base and emitter. Because the collector current need only travel a short distance through the lightly-doped subcollector, before reaching the buried collector layer, the overall collector resistance is minimized, while still providing a high breakdown voltage because of the lightly-doped subcollector.

This construction results in a significant dopant concentration gradient at the interface between the buried collector regions and the much more lightly-doped overlying subcollector. This gradient does not itself present a problem in the stability of the device. However, because this interface must be created relatively early in the manufacturing process, subsequent high temperature processes provide the opportunity for dopant to diffuse from the buried collector region into the more lightly-doped subcollector. A particularly troublesome high temperature process is the epitaxial formation of the subcollector itself, which exposes the wafer to high temperatures for a relatively long period of time. This updiffusion of dopant from the buried collector can cause significant limitations in the performance and precision of modern bipolar circuits.

FIG. 1a illustrates an example of this problem in conventional PNP bipolar transistor 10p. While transistor 10p, in this example, is fabricated in a silicon-over-insulator (SOI) structure, it is to be understood that the issue of diffusion from the buried layer also occurs in a bulk device, although the diffusion deeper into the substrate is harmless. Buried oxide layer 4 is disposed over single-crystal silicon handle wafer 2, and under thin film (single-crystal) silicon layer 6, 6'. This SOI structure may be formed by way of any one of the known conventional techniques, including wafer bonding, implanted oxygen (SIMOX), and the like. Epitaxial layer 8 is disposed over thin film silicon layer 6, and extends toward the surface of the structure as shown. Isolation structures in transistor 10p include deep trench isolation oxide structures 9, and shallow trench isolation structures 12, both of which are formed by etching into (and possibly through) epitaxial layer 8 and thin film silicon layer 6, as desired. The active portions of transistor 10p include the collector region formed in epitaxial layer 8 (i.e., the subcollector), base layer 11, and polycrystalline emitter electrode 15. Emitter contact E, base contacts B and collector contact C make electrical contact to the device by way of a metal contact to tungsten plugs 16e, 16b, 16c, respectively. Diffusion of dopant from emitter electrode 15 into base layer 11 forms the active emitter of the device, at which location the bipolar transistor action takes place.

Buried collector region 6 is a heavily doped (p-type, in this example) portion of thin film silicon layer 6; portions 6' of this layer away from transistor 10p are relatively lightly doped, or intrinsic silicon. Buried collector region 6 provides a low resistance path between collector contact C and the active collector region. Accordingly, collector-emitter current is conducted vertically through epitaxial layer 8 from buried collector region 6 to emitter 15, as illustrated in FIG. 1a. The provision of buried collector region 6 thus improves the performance of transistor 10p by minimizing series collector resistance.

However, as shown in FIG. 1a, dopant from buried collector region 6 has diffused well into epitaxial layer 8. In FIG. 1a, boundary B illustrates the top surface of thin film silicon layer 6, 6', from which epitaxial layer 8 was formed. As evident from FIG. 1a, even where epitaxial layer 8 is intrinsic or lightly-doped when formed, boron from buried collector region 6 diffuses by a distance d into epitaxial layer 8, during the high temperature epitaxial process (and during other subsequent high temperature processes). This updiffusion of dopant into epitaxial layer 8 greatly reduces the control of device parameters, as discussed above. Efforts to reduce this updiffusion are known to have detrimental device effects. For example, reduction in the time and temperature of subsequent processes such as densification of isolation structures 9, 12, can reduce the integrity of these oxides. Increasing the thickness of epitaxial layer 8 to compensate for the updiffusion effect not only exacerbates the diffusion itself (by increasing the time or temperature of the process), but also is incompatible with the fabrication of high performance and high-speed devices.

The effect of diffusion from buried collector regions into the device subcollector becomes particularly dramatic in complementary bipolar structures, which by definition include both NPN and PNP bipolar devices, and their respective n-type and p-type buried collector layers. FIG. 1b illustrates the incorporation of transistor 10p into a complementary structure, in which NPN transistor 10n is adjacent to PNP transistor 10p in the same integrated circuit. The construction of transistors 10p, 10n is substantially similar to that illustrated in FIG. 1a for transistor 10p; of course, in the case of transistor 10n, the conductivity type of the doped regions is opposite that of transistor 10p in order for transistor 10n to be of the NPN type.

Typical dopant species for n-type and p-type buried layers 6n, 6p are arsenic and boron, respectively. These species differ in diffusion rate by a factor of ten, however, with boron diffusing much faster than arsenic under equivalent conditions. This difference in diffusion rate is evident from FIG. 1b, in which the subcollector thickness t in PNP transistor 10p is much shorter than the subcollector thickness t in NPN transistor 10n, because boron from p-type buried collector region 6p diffuses much faster than arsenic from n-type buried collector region 6n. Not only does the undesired diffusion from each buried layer reduce the performance of individual transistors 10p, 10n, but the difference in diffusion rate also causes mismatch between the complementary transistors in a given circuit. This mismatch renders the delicate balance of the trade-off between NPN and PNP performance, and the necessary optimization techniques, even more difficult. Besides compromising the ultimate performance of the circuit, this device type asymmetry also can reduce the power efficiency of the complementary design. The trend toward construction of CBiCMOS integrated circuits, which include both complementary bipolar and also complementary metal-oxide-semiconductor (MOS) transistors, will make the effects of buried layer updiffusion even less tolerable.

In addition to the loss of control over the buried layer-subcollector interface, undesired diffusion from heavily-doped buried layers can also contaminate structures away from the buried layers, due to auto-doping during epitaxial growth. An example of such undesired diffusion is illustrated in FIG. 1b, where isolation structure 19 includes dopant from both of buried collector regions 6p, 6n (trench isolation structure 9 being formed after the epitaxial growth of layer 8. Such contamination can result in device leakage, shifts in threshold voltages, and poor breakdown characteristics in bipolar and MOS devices, as well as in diodes and passive devices.

The sensitivity of complementary bipolar devices to differences in diffusion from the n-type and p-type buried layers is conventionally addressed by constraining the thermal budget for subsequent processing, thus limiting the diffusion from these layers and thus limiting the resulting diffusion. These constraints have resulted in very complex processing that is not only costly, but also typically results in the inability to maximize the performance of the NPN and PNP devices in a symmetric manner (i.e., without sacrificing the performance of one for the performance of the other).

Besides impacting device performance, as noted above, diffusion from the buried collector layers also impacts the breakdown voltage of the individual devices. In the complementary bipolar arrangement, in order to optimize symmetric breakdown behavior for the NPN and PNP devices, the significant difference in diffusion rates necessitates a trade-off between device breakdown for one of the transistor types (PNP) and collector resistance of the other of the transistor types (NPN). In addition, the asymmetric diffusion of the dopant species also creates mismatching of the device characteristics of NPN and PNP devices in a complementary circuit; such mismatches are especially undesirable, considering that the matching of device characteristics is a primary reason for realizing a circuit in complementary bipolar technology in the first place. In addition, the tight constraint on thermal budget because of the rapid diffusion of boron from the buried collectors of the PNP devices also increases the likelihood of mismatch among the PNP devices themselves, as these devices can become quite sensitive to the processing conditions that fall within the thermal budget constraints. These and other device sensitivities are also exacerbated as the physical device sizes continue to scale toward ever decreasing dimensions.

BRIEF SUMMARY OF THE INVENTION

It is therefore an object of the present invention to provide an integrated circuit and method of fabrication that reduces diffusion of dopant from buried doped layers, such as buried collector layers in bipolar transistors.

It is a further object of the present invention to provide such an integrated circuit and method that is especially well-suited for complementary bipolar technology.

It is a further object of the present invention to provide such an integrated circuit and method that retards the diffusion of one dopant species while enhancing the diffusion of a different dopant species, for example to provide a symmetric emitter profile for complementary devices.

Other objects and advantages of the present invention will be apparent to those of ordinary skill in the art having reference to the following specification together with its drawings.

The present invention may be implemented by way of an integrated circuit and method that incorporates carbon into the buried doped layers. The carbon may be incorporated as elemental carbon, or alternatively by the compound SiGeC. Various methods of applying the carbon may be used.

DETAILED DESCRIPTION OF THE INVENTION

The present invention will now be described in connection with its preferred embodiments. These exemplary embodiments are directed to the fabrication of bipolar junction transistors in a silicon-on-insulator (SOI) structure. It will be appreciated by those skilled in the art having reference to this specification that the present invention may be used to form either PNP or NPN transistors, or both as may be used in a complementary bipolar or BiCMOS technology, as well as used in other alternative structures and methods of fabricating such structures. In addition, while this invention is particularly beneficial as applied to SOI structures, it is also contemplated that this invention may be utilized in bulk integrated circuit devices as well, where no buried insulator layer is present. Furthermore, while these embodiments are silicon or SiGe NPN and PNP bipolar transistors, it is contemplated that the present invention will be equally applicable to emerging bipolar technologies such as SiGeC (silicon-germanium-carbon) and SiC bipolar technologies It is therefore to be understood that these and other alternatives to the embodiments described below are contemplated to be within the scope of the invention as claimed.

Figure 1A:
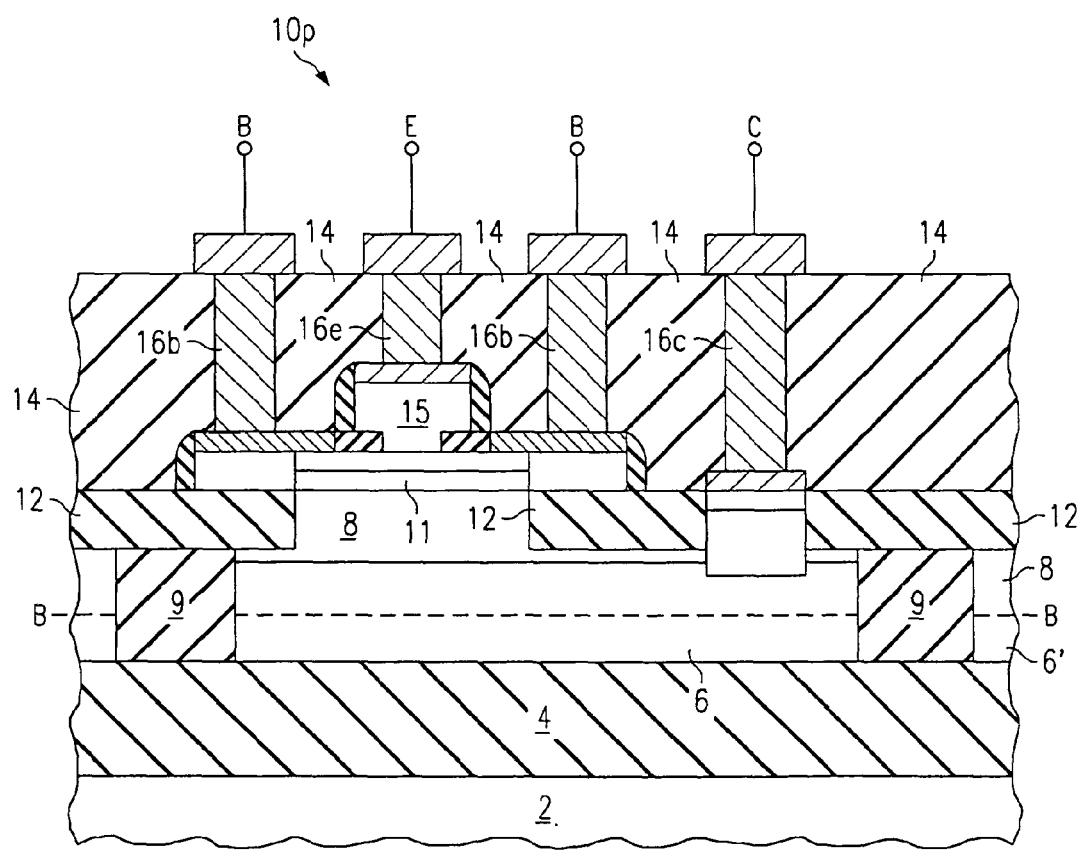
FIGS. 1a and 1b are cross-sectional diagrams of conventional bipolar transistors.
Figure 1B:
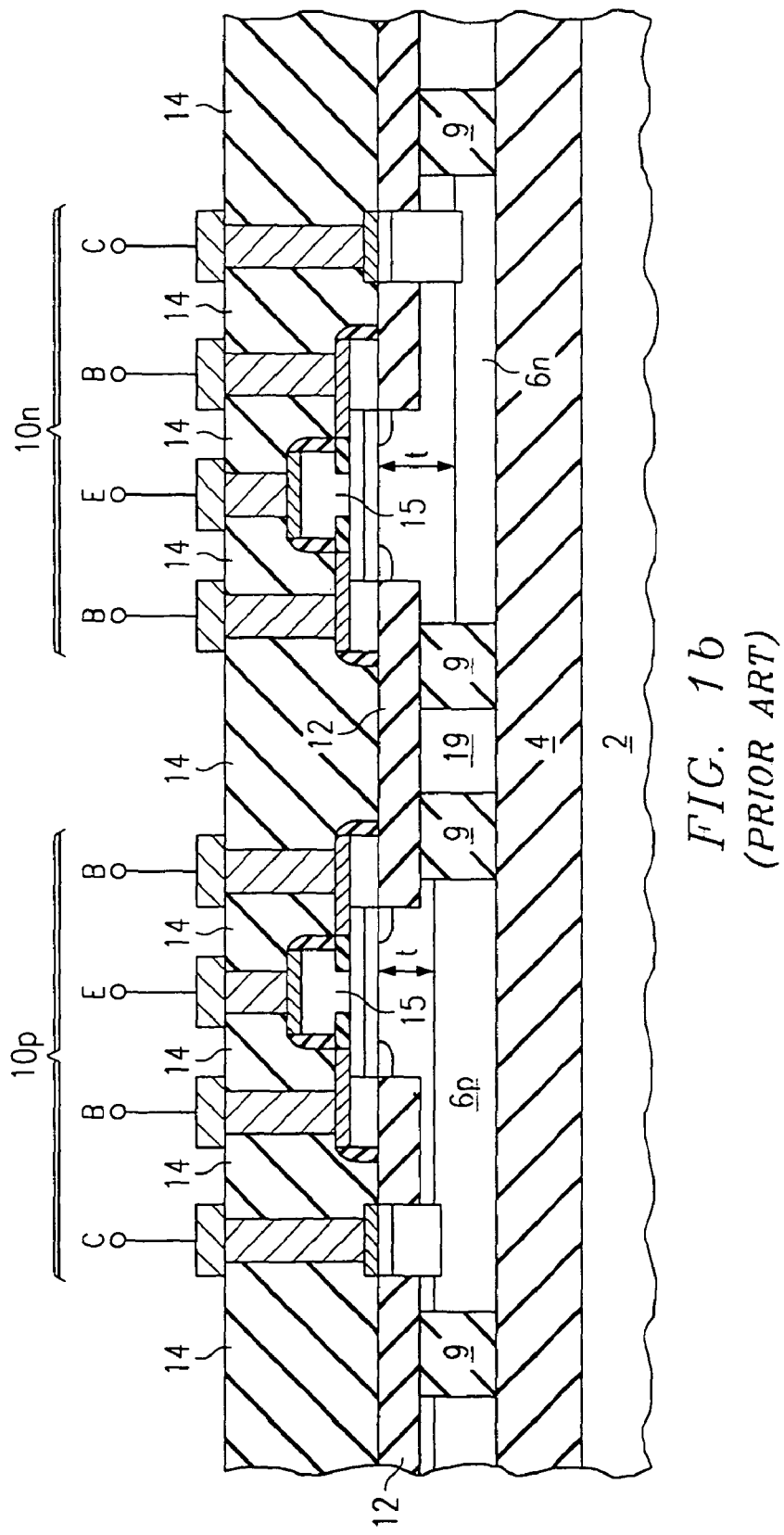
Figure 2A:
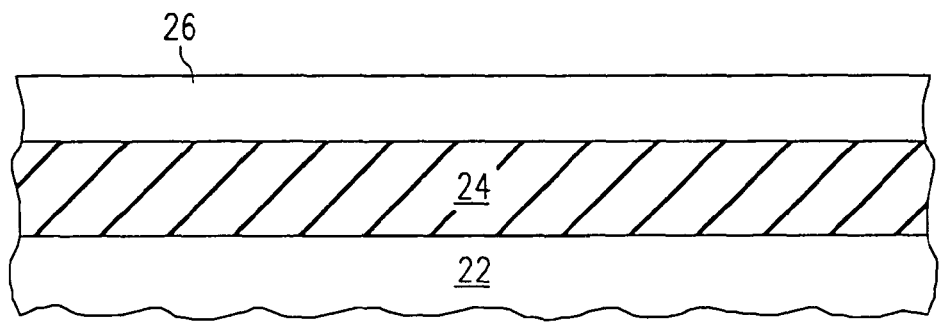
FIGS. 2a through 2g are cross-sectional diagrams illustrating the fabrication of a transistor according to a first preferred embodiment of the invention.

Referring first to FIG. 2a, the construction of PNP transistor 30 according to the preferred embodiment of the invention will now be described in detail. The cross-section of transistor 30 in FIG. 2a illustrates buried insulator layer 24 in place over substrate, or handle wafer, 22 in the typical manner for silicon-on-insulator (SOI) structures. Buried insulator layer 24 is typically silicon dioxide, and as such is generally referred to as buried oxide. Single-crystal silicon thin film layer 26 is disposed over buried oxide layer 24.

The formation of the structure of buried insulator layer 24 underlying thin film silicon layer 26 may be accomplished by any one of a number of technologies. These technologies include the wafer bonding approach, in which two single-crystal silicon wafers are bonded to one another on either side of a silicon oxide layer, to result in single-crystal layers on either side of the insulator layer. According to another approach, referred to in the art as SIMOX, a single crystal silicon wafer is implanted with oxygen ions, so that a high concentration of oxygen is present at a selected depth within the wafer. The oxygen is thermally reacted with the silicon to form a buried oxide layer about the depth of implantation. These and other conventional techniques for fabricating an SOI structure are suitable for use in connection with this invention.

Figure 2B:
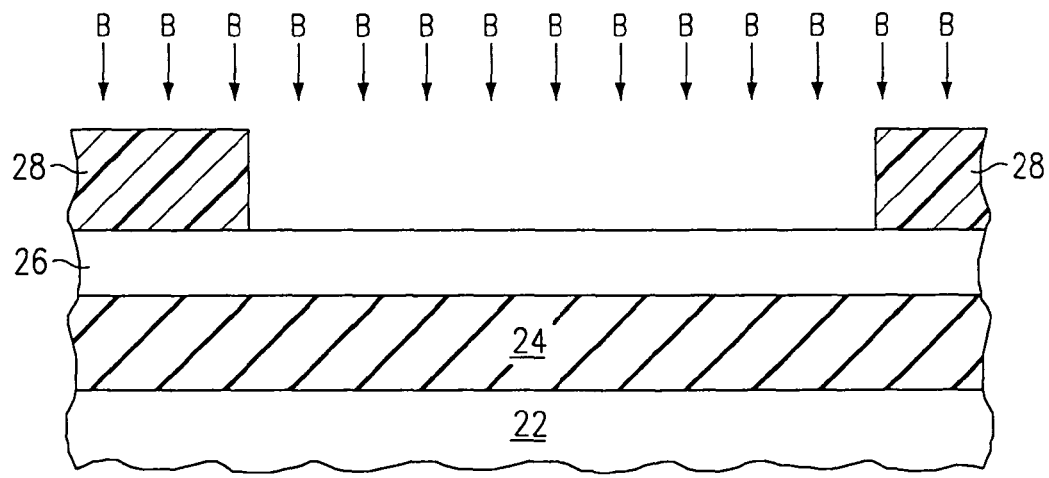
Figure 2C:
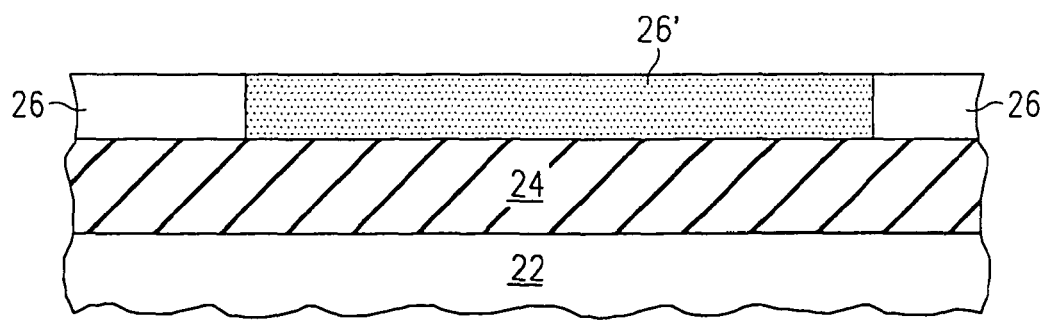

For the construction of PNP transistor 30 according to the preferred embodiment of the invention, a p-type buried collector region is next formed. Referring now to FIG. 2b, mask layer 28 defines the locations at which the p-type buried collector region is to be formed by way of ion implantation. In this example, mask layer 28 is preferably a hard mask, such as silicon dioxide; alternatively, mask layer 28 may consist of photoresist, depending upon the energy and dose of the implant. In the case where mask layer 28 is an oxide, mask layer 28 is formed by conventional chemical vapor deposition of silicon dioxide overall, followed by photolithographic masked etching of the oxide layer to define mask layer 28, exposing those locations of the surface of silicon thin film layer 26 at which the buried collector region is to be formed. For the fabrication of the PNP transistor, the structure is subjected to boron ion implantation to dope the exposed portions of silicon thin film layer 26, as shown in FIG. 2b. For example, the implantation of boron is carried out at a relatively heavy dose such as $1.0E16$ cm$^{-2}$, at an energy of 30 keV. Following a corresponding anneal and removal of mask layer 28, buried collector region 26' is formed in silicon thin-film layer 26 as shown in FIG. 2c.

Figure 2D:
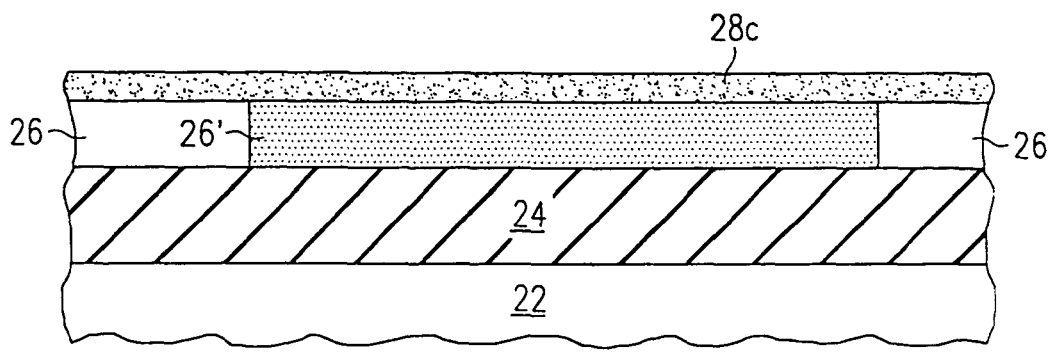

To form the active portions of eventual PNP transistor 30, epitaxial silicon is then grown over silicon thin film layer 26, 26'. According to a first preferred embodiment of the invention, this epitaxial growth begins with the epitaxial formation of diffusion barrier 28c, as will now be described relative to FIG. 2d. Diffusion barrier 28c is a silicon layer that contains dopant material that has the effect of retarding the diffusion of boron, such as that contained within buried collector region 26'. Examples of this retarding dopant material include carbon, and silicon-germanium-carbon (SiGeC). According to this embodiment of the invention, diffusion barrier 28c is formed by epitaxial growth of silicon from silicon thin film layer 26, 26' in the presence of a carbon or SiGeC source. A preferred example of the concentration of carbon in diffusion barrier layer 28c is 0.1% atomic, although this concentration may vary according to the particular manufacturing environment.

Figure 2E:
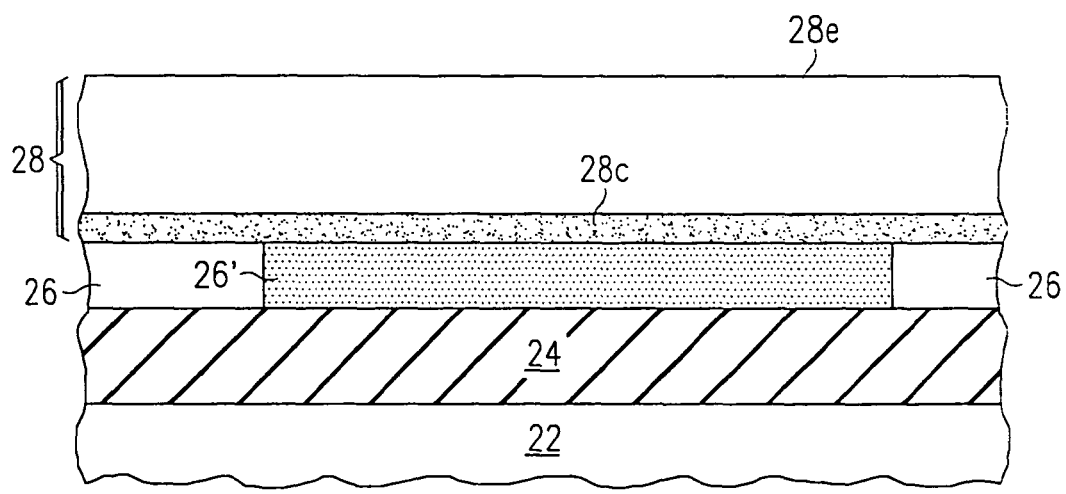

Following the formation of diffusion barrier 28c, epitaxial growth of silicon continues in the absence of the diffusion-retarding dopant, until epitaxial silicon layer 28, including both diffusion barrier 28c and silicon layer 28e, is present over silicon thin-film layer 26, 26' at the desired thickness. FIG. 2e illustrates the construction of the integrated circuit structure upon completion of the epitaxial formation. Overlying epitaxial layer 28e may be intrinsic silicon, or lightly-doped, depending upon the design of the transistors to be formed. The doping concentration of epitaxial layer 28e may be set during epitaxy, or alternatively a subsequent doping process may be carried out.

Figure 2F:
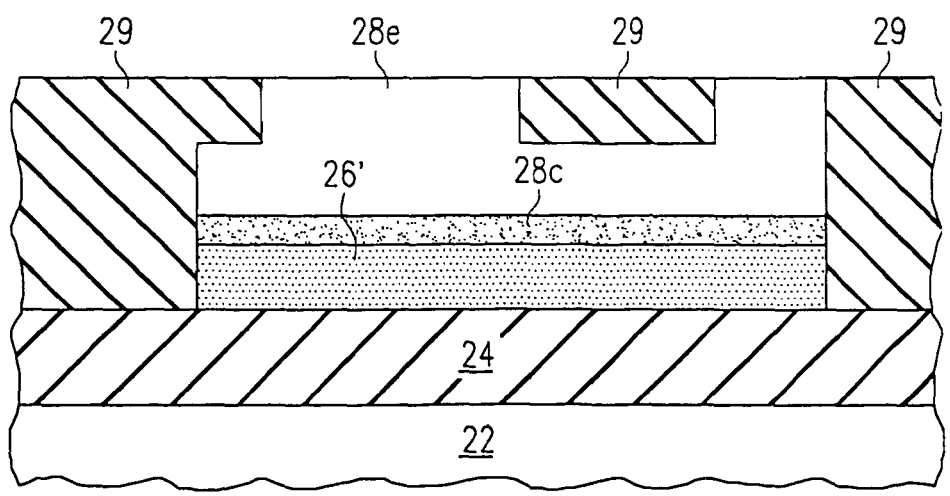

Upon completion of epitaxial layer 28, isolation structures may now be formed to separate the individual devices from one another. In this embodiment of the invention, as shown in FIG. 2f, trench isolation structures 29 are formed into locations of epitaxial layer 28 and silicon thin film layer 26, extending in this example fully down to buried oxide layer 24. For example, isolation structures 29 may be formed by first performing a masked etch of epitaxial layer 28 to a relatively shallow depth, and then performing a second masked etch through the remaining portion of epitaxial layer 28 within the etched locations, and extending the etch until reaching buried oxide layer 24. Insulating material, such as silicon dioxide, is then deposited overall, filling the etched trenches into and through epitaxial layer 28 and silicon thin film layer 26. A planarizing etchback is then preferably performed, so that the top surfaces of trench isolation structures 29 are substantially coplanar with the top of the active region of epitaxial layer 28, as shown in FIG. 2f. Accordingly, trench isolation structure 29 of this embodiment of the invention each include both deep and shallow portions, as shown in FIG. 2f. Especially in combination with buried oxide layer 24, isolation structures 29 are effective to electrically isolate the individual transistors from one another. A relatively large portion of epitaxial layer 28e remains at the surface of the structure, surrounded by isolation structures 29, and into which PNP transistor 30 will be formed; a smaller portion of epitaxial layer 28e also extends to the surface of the structure, through which collector contact will be made as will be described in further detail below.

Figure 2G:
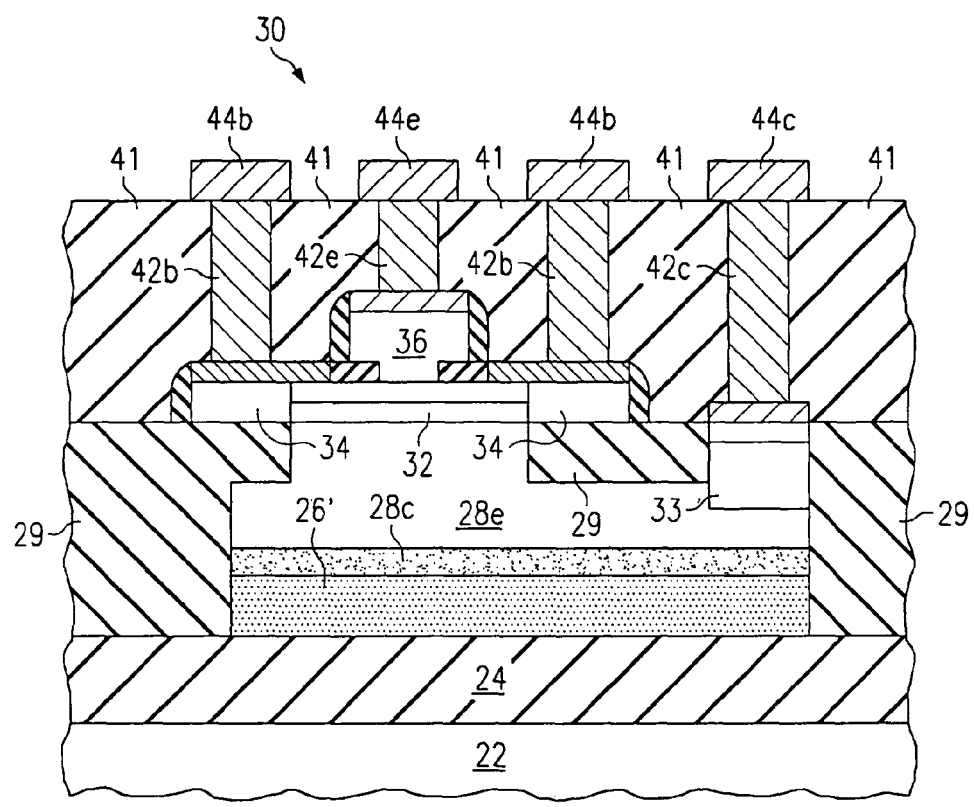

The remainder of PNP transistor 30, according to this first preferred embodiment of the invention, is now completed in the conventional manner, resulting in the structure of FIG. 2g. Collector sinker structures 33 are heavily doped p-type silicon regions of epitaxial layer 28e, and may also include a still more heavily p+ doped region at the surface, and perhaps silicide cladding, to further improve ohmic contact.

In the active region of PNP transistor 30, intrinsic base region 32 is an n-type doped silicon or n-type silicon-germanium epitaxial layer disposed at the surface of collector region 10. Extrinsic base structures 34 are heavily doped n-type silicon regions surrounding intrinsic base region 32, with silicide-clad ohmic contacts at portions of their surface. Extrinsic emitter 36 is disposed at the surface of intrinsic base region 32 between extrinsic base structures 34. Extrinsic emitter 36 is a heavily doped p-type polysilicon structure, which serves as a source of p-type dopant that diffuses into intrinsic base region 32 to form the emitter of the device. The surface of extrinsic emitter 36 is also preferably silicide-clad.

Transistor 30 in this embodiment of the invention provides external collector, base, and emitter connections by way of tungsten contact plugs 42c, 42b, 42e, respectively, each of which extend through overlying insulator layer 41 to corresponding metal conductors 44c, 44b, 44e, respectively. Conductors 44c, 44b, 44e route connections to the collector, base, and emitter, respectively, to and from other devices in the same integrated circuit as transistor 30.

Figure 3:
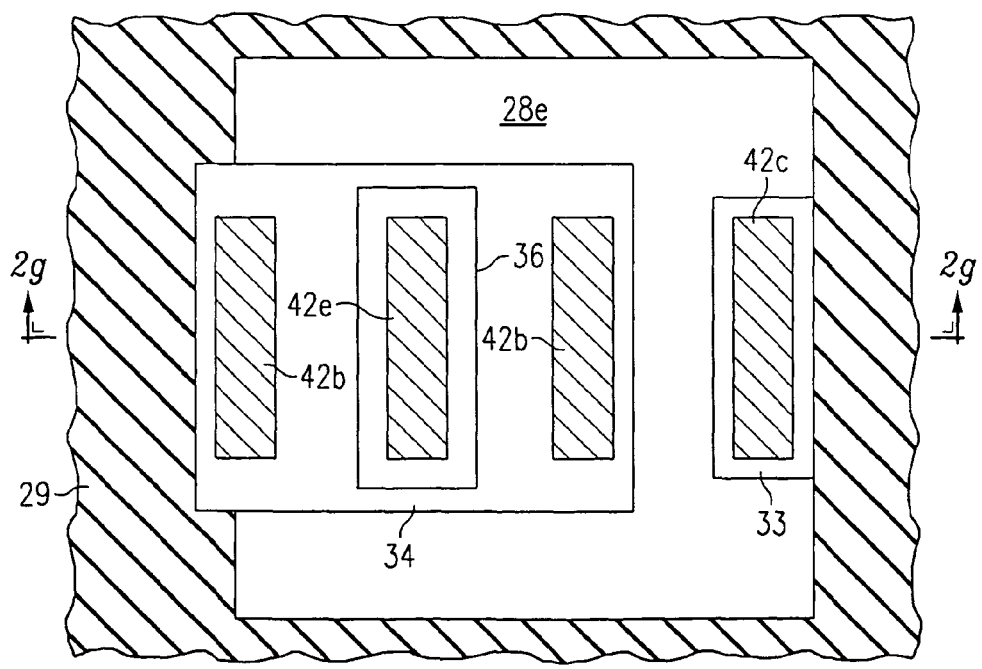
FIG. 3 is a plan view of the transistor constructed according to the first preferred embodiment of the invention.

FIG. 3 illustrates PNP transistor 30 of FIG. 2g in plan view, at a point in the process prior to the formation of the metal layer used to form conductors 44; silicide cladding of various structures is not shown in FIG. 3, for purposes of clarity. Of course, transistor 30 may alternatively be circular in shape, or take such other alternative shapes depending upon the particular device application.

According to this first preferred embodiment of the invention, the provision of diffusion barrier 28c tends to confine the boron dopant of buried collector 26' within the combination of buried collector region 26' and diffusion barrier 28c, inhibiting its diffusion into the overlying epitaxial layer that forms subcollector 28e of PNP transistor 30. As noted above, the boron dopant within buried collector region 26' will tend to diffuse during the high temperature steps of the formation of subcollector 28e, the anneal to diffuse emitter dopant from emitter electrode 36 into base layer 32, and the like. According to this invention, however, it is believed that the carbon dopant in diffusion barrier 28c reduces the number of interstitial locations that would otherwise be used by boron diffusing upward from buried collector region 26'. The boron dopant thus remains within diffusion barrier 28c instead of diffusing upward into the more lightly-doped subcollector 28e.

By controlling and limiting the diffusion from buried collector region 26' via diffusion barrier 28c, the subsequent high temperature processes can be optimized without the additional thermal budget constraint that would otherwise be present if updiffusion from buried collector 26' were of concern. In addition, the thickness of the epitaxial layer forming subcollector 28e can be more closely optimized for device speed and breakdown performance, because of the improved control of the location of the interface between the more lightly-doped subcollector 28e and buried collector region 26'. The matching of similar transistors across the integrated circuit and among integrated circuits on the same wafer, which is particularly important in analog applications, is also contemplated to be facilitated by this invention, because any thermal variations across the wafer provide much less effect on the devices themselves.

Figure 4:
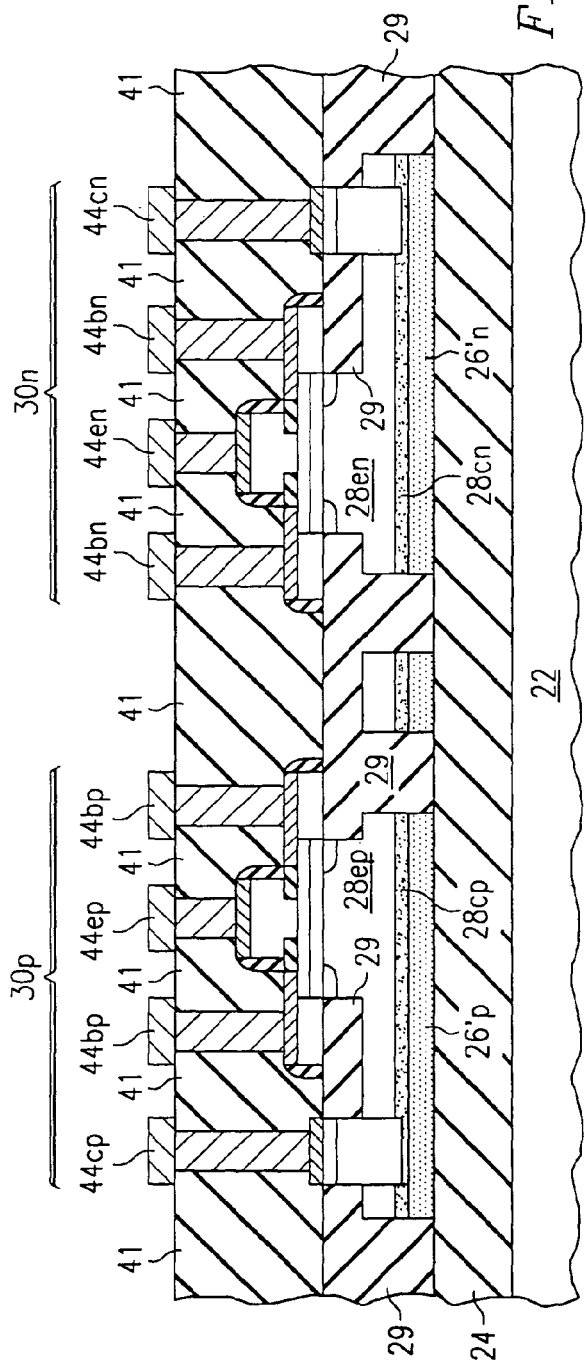
FIG. 4 is a cross-sectional diagram of complementary bipolar transistors constructed according to the first preferred embodiment of the invention.

This first preferred embodiment of the invention may also be used to advantage in complementary bipolar integrated circuits, as will now be described relative to FIG. 4. In the structure of FIG. 4, PNP transistor 30p and NPN transistor 30n are formed in the same silicon-on-insulator integrated circuit, in which buried oxide layer 24 is disposed on handle wafer 22, as before. Transistor 30p is constructed in the manner described above relative to FIGS. 2a through 2g, and transistor 30n is constructed similarly as transistor 30p, except that its collector and emitter structures are doped n-type rather than p-type, and its base structure is doped p-type rather than n-type, so that an n-p-n device is formed.

As shown in FIG. 4, transistors 30p, 30n have buried collector regions 26'p, 26'n, respectively. Each of these buried collector regions 26' are heavily doped portions of a silicon thin-film layer, each providing a low resistance path to the respective collector contacts 44c. In this embodiment of the invention, buried collector region 26'n is heavily-doped with phosphorous, which is an n-type dopant; buried collector region 26'p is boron-doped, as described above. The doping of buried collector regions 26' is performed by respective masked ion implant processes, followed by one or two anneals to diffuse the implanted dopant within the eventual buried collector regions 26'. As described above relative to FIG. 2d, according to this embodiment of the invention, an initial stage of epitaxial growth including a source of carbon is then carried out to form diffusion barriers 28cp, 28cn. According to this embodiment of the invention, the carbon source may include simply carbon doping of the epitaxial growth of silicon, or alternatively the formation of an epitaxial layer of SiGeC. In either case, diffusion barriers 28cp, 28cn are formed in a blanket manner as portions of a thin, carbon-bearing, epitaxial layer overlying buried collector regions 26'p, 26'n. The epitaxial growth of single-crystal silicon then continues, but in the absence of the carbon source, in the manner described above relative to FIG. 2e, to form a silicon layer from which the epitaxial regions forming subcollectors 28ep, 28en will be defined.

Following the formation of this epitaxial layer, the construction of transistors 30p, 30n proceeds in much the manner as described above relative to FIGS. 2f and 2g; again, inverse dopant conductivity types are used to form NPN transistor 30n as compared with those used in PNP transistor 30p. These additional processes include the formation of trench isolation structures 29 that separate buried collector regions 26'p, 26'n from within their common silicon thin film layer, and that separate diffusion barriers 28cp, 28cn and subcollectors 28ep, 28en from within their common epitaxial layer. Trench isolation structures 29, in combination with buried oxide layer 24, electrically isolate transistors 30p, 30n from one another and from other devices in the same integrated circuit, except as intentionally interconnected by overlying metal conductor layers.

Transistors 30p, 30n of FIG. 4 both receive the benefits of diffusion barriers 28cp, 28cn, respectively, that are described above relative to transistor 30. In summary, diffusion barriers 28c confine or inhibit dopant diffusion from buried collector regions 26'; this permits subsequent high temperature processes to be optimized without concern for the effects of updiffusion from buried collector regions 26'. The epitaxial layer containing subcollector 28e can readily be optimized for device speed and breakdown performance, and transistor matching is much improved over the integrated circuit itself and among integrated circuits on the same wafer.

Additional benefits are provided by the present invention when applied to complementary bipolar structures such as shown in FIG. 4 according to this embodiment of the invention. As noted above, typically boron diffuses at a much faster rate than n-type dopants such as arsenic and phosphorous; as a result, in conventional complementary bipolar structures having buried collector regions, not only would the buried collector dopant diffuse into the collector regions, but this diffusion would tend to be asymmetric because of the different diffusion rates. According to this embodiment of the invention, however, because the updiffusion from the buried collector regions 26' is controlled by diffusion barriers 28c in both of transistors 30p, 30n, no such asymmetry in collector dopant profiles occurs, regardless of the thermal processing carried out after the formation of buried collectors 26'. Accordingly, such processes as emitter diffusion may be carried out simultaneously and symmetrically for both of PNP and NPN transistors 30p, 30n, simplifying the fabrication of these devices. In addition, the complementary matching between similarly constructed transistors 30p, 30n is made much easier because the asymmetry of the buried collector outdiffusion is eliminated.

Various alternatives to this embodiment of the invention are also contemplated. One such alternative is the addition of a germanium buffer layer over the buried collector regions 26', in addition to the carbon-bearing diffusion barriers 28e. This germanium layer, which may be formed by the epitaxial deposition of SiGe, is contemplated to improve the quality of the epitaxial silicon formed thereover, and is also contemplated to further retard the diffusion of dopant into the epitaxial silicon.

Another alternative to this embodiment of the invention is based on the diffusion enhancing effect that carbon species have on arsenic dopant. It is known in the art that boron diffuses much more readily in silicon than does arsenic. However, while the carbon species is known to retard the diffusion of boron, carbon is known to enhance the diffusion of arsenic, and also antimony (also an n-type dopant). This enhancement is believed to be due to the creation of additional substitutional locations caused by the carbon as a dopant. According to this alternative realization, the carbon-bearing species is included in the epitaxial growth of silicon over a p-type buried layer doped with boron, and an n-type buried layer doped with arsenic. It is contemplated, according to this alternative, that the carbon source can be controlled during epitaxy to provide a carbon concentration that retards the diffusion of boron and enhances the diffusion of arsenic to such an extent that the resulting dopant concentration gradient of the two conductivity types is substantially equal. In this way, matching of the construction and characteristics of the complementary bipolar devices is contemplated to be facilitated according to this invention.

As is evident according to the description of these embodiments of the invention, the carbon-bearing diffusion barrier layer is formed in a blanket manner, by the epitaxial deposition of carbon-bearing silicon or silicon-germanium. Further adjustment and control of the diffusion of dopant from buried layers can be attained, according to the present invention, by forming the diffusion barrier layers only in selected regions, as will now be described in connection with additional alternative preferred embodiments of the invention.

Figure 5A:
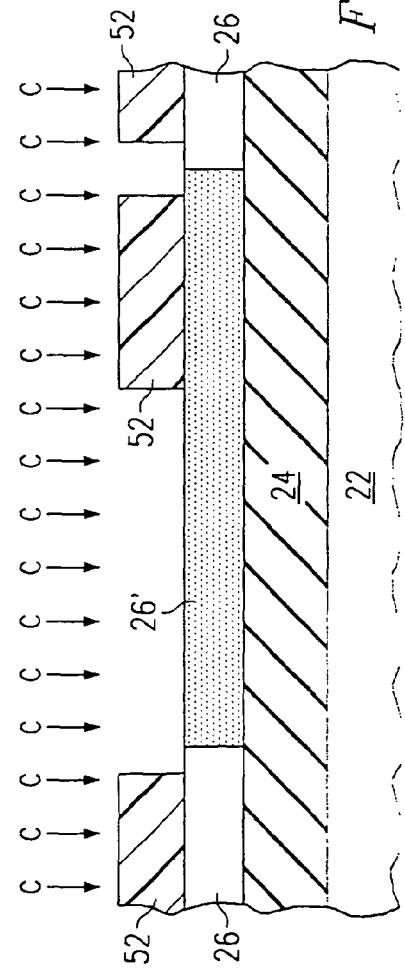
FIGS. 5a and 5c are cross-sectional diagrams of the construction of a transistor according to a second preferred embodiment of the invention.

Referring now to FIG. 5a, the fabrication of PNP transistor 50p according to an alternative embodiment of the invention will now be described. As will be evident from the following description, a similar approach may be used in the fabrication of both PNP and NPN transistors, for example in a complementary bipolar structure. FIG. 5a illustrates, in cross-section, a partially-fabricated integrated circuit structure, in which buried insulator layer 24 in place over handle wafer 22 in the typical manner for SOI structures. Single-crystal silicon thin film layer 26 is disposed over buried oxide layer 24, in which buried collector region 26' is formed by way of a masked ion implantation and subsequent diffusion anneal.

Mask layer 52 is formed over the surface of silicon thin film layer 26 as shown in FIG. 5a, to expose selected locations of layer 26 and buried collector region 26' to the ion implantation of carbon or a carbon-bearing material such as SiGeC. According to this embodiment of the invention, it is desirable to form a diffusion barrier over the portion of buried collector region 26' that will underlie the emitter and base structures, but it is also desirable to not form this diffusion barrier at the locations at which the collector contact will be made. To the extent that dopant diffuses from the buried collector region 26' toward the collector contact, such diffusion will help in reducing the collector resistance, and may additionally reduce the depth to which the collector contact structure need be formed into epitaxial silicon. In addition, it is desirable to form a diffusion barrier along the edges of buried collector contact region 26', to inhibit lateral diffusion of dopant from this structure during subsequent silicon epitaxy.

Figure 5B:
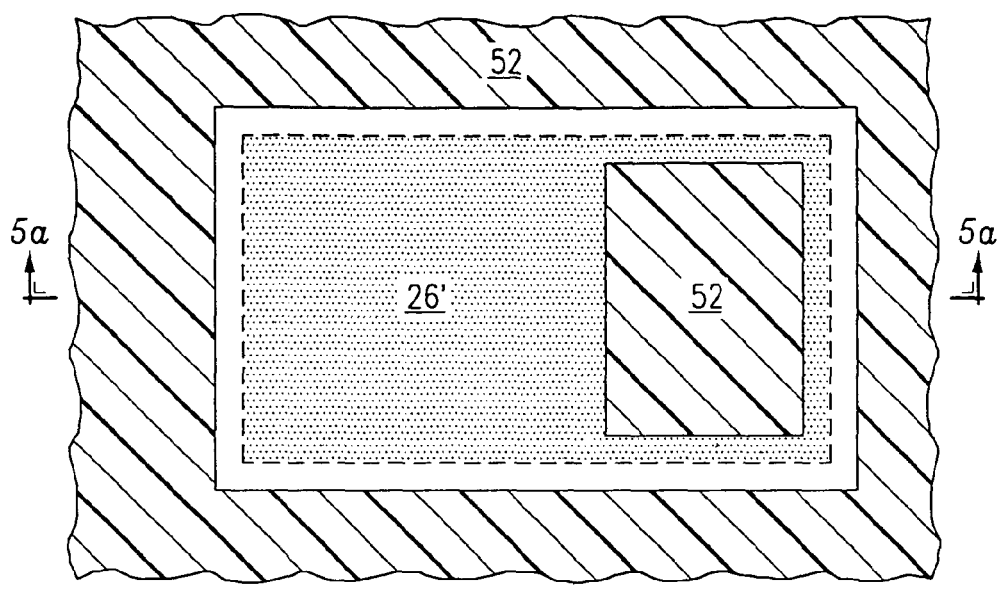
FIG. 5b is a plan view of a mask used in the construction of the transistor of FIGS. 5a and 5c according to the second preferred embodiment of the invention.

Accordingly, as shown in FIG. 5a in cross-section, and in FIG. 5b in plan view, openings are formed in mask layer 52 to define the locations at which the carbon-bearing implant is to have an effect on the structure. According to the preferred embodiment of the invention, mask layer 52 is formed of sufficiently opaque material to the ion implantation to protect the selected underlying portions of layer 26 from the implant. For example, mask layer 52 may be formed of photolithographically patterned and etched silicon dioxide as a hard mask layer, or alternative of photolithographically patterned photoresist of sufficient thickness to stop the ion implantation carried out at the desired energy and dose. FIG. 5b illustrates that mask layer 52 is patterned to cover expose buried collector region 26' over its portion at which the active portion of transistor 50 (including its subcollector) will be formed; as evident from FIGS. 4a and 4b, the boundaries of buried collector region 26' are also exposed to receive the carbon-bearing implant, to reduce lateral diffusion of dopant from buried collector region 26'. Mask layer 52 covers the portion of buried collector region 26' at which the buried collector contact will be formed.

The diffusion barrier species to be implanted, according to this embodiment of the invention, is preferably a carbon-bearing species. Elemental carbon itself may be implanted, or alternatively a carbon-bearing material such as SiGeC may be implanted. The energy and dose of the carbon-bearing implant is selected, according to conventional implant design techniques and depending upon the species being implanted; in either case, however, the energy may be kept relatively low because the bulk of the implanted carbon-bearing material preferably resides at the upper surface of buried collector layer 26', to prevent updiffusion of the dopant.

After the implant of the carbon-bearing species, construction of PNP transistor 50p continues in similar manner as described above relative to FIGS. 2e through 2g. In summary, silicon is epitaxially grown (in the absence of a diffusion-retarding dopant) to form epitaxial silicon layer 28 of the desired thickness over silicon thin-film layer 26, 26'. As before, the doping concentration of epitaxial layer 28 may be set during epitaxy, or alternatively a subsequent doping process may be carried out. Trench isolation structures 29 are then formed at the appropriate locations of epitaxial layer 28 and silicon thin film layer 26. The remainder of PNP transistor 50p is then completed as before, resulting in the structure shown in FIG. 5c, with the same reference numerals as in FIG. 2g referring to the same structures if present in transistor 50p.

Figure 5C:
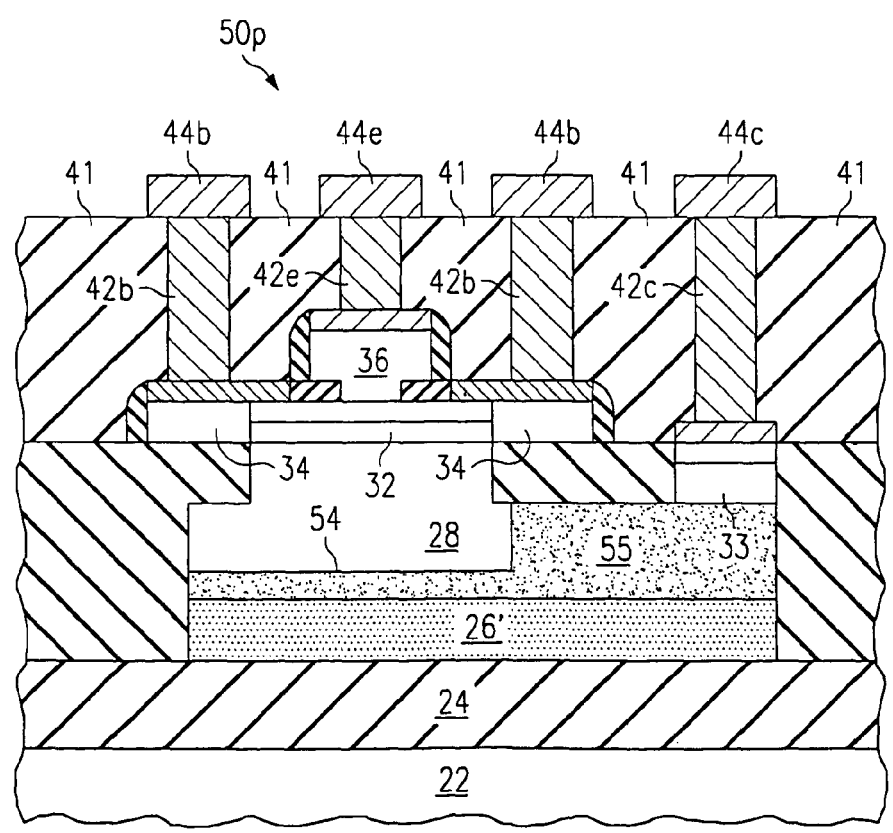

As shown in FIG. 5c, the effect of the masked carbon-bearing species implant according to this embodiment of the invention is to define those locations at which dopant in p-type buried collector region 26' is to be confined, and retarded from diffusing into the subcollector portion of epitaxial layer 28, and to also define those locations at which dopant in p-type buried collector region 26' is to be permitted to updiffuse into epitaxial layer 28. As shown in FIG. 5c, updiffused dopant from buried collector layer 26' only slightly diffuses into epitaxial layer 28 at location 54 underlying emitter polysilicon 36, at which is the active portion of transistor 50p. On the other hand, dopant has updiffused from buried collector layer 26' at location 55 of epitaxial layer 28. Location 55 corresponds to the portion of buried collector layer 26' that was protected by mask layer 52 from the carbon-bearing species implant, and therefore there is substantially no barrier to updiffusion at this location. Collector sinker structure 33 is thus readily able to connect to this more heavily doped location of epitaxial layer 28, which provides a high conductivity connection between conductor 44c and buried collector layer 26'.

According to this embodiment of the invention, therefore, the selective masked implant of the diffusion-retarding carbon-bearing species allows selection of those locations at which updiffusion from the underlying buried layer is to be inhibited, and those locations at which such updiffusion is to be permitted. As shown in FIG. 5c, this selective implant allows for the active portion of the transistor to be protected from updiffusion from the buried layer, while still permitting updiffusion at collector contact locations to provide a low resistance connection to the buried collector layer without the necessity of additional processing to provide such a heavily doped connector, such additional processing including a high energy, high dose, masked implant for making the collector contact.

The selective masking of the carbon-bearing implant can also be used to advantage in complementary bipolar structures, in particular to improve the matching of dopant diffusion between the transistors of different conductivity types.

Figure 6:
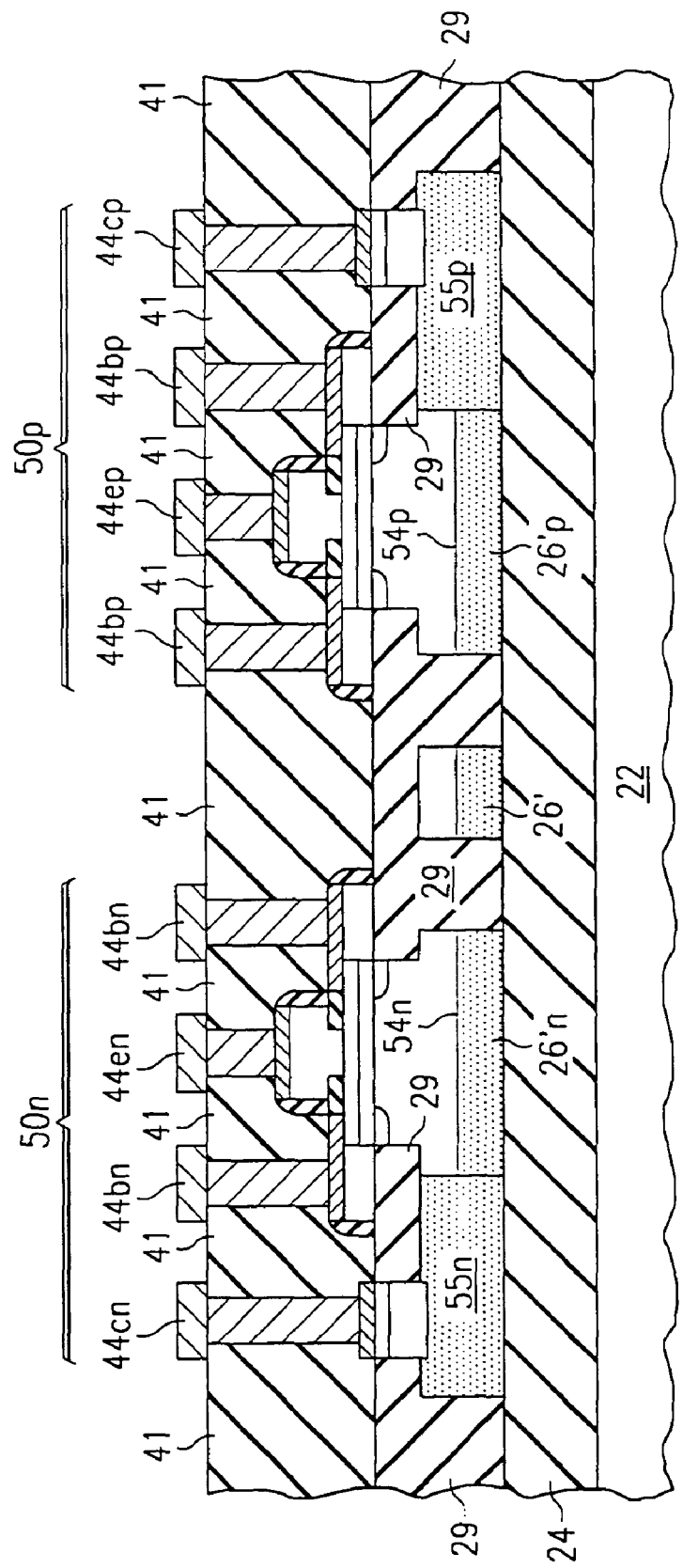
FIG. 6 is a cross-sectional diagram of complementary bipolar transistors constructed according to the second preferred embodiment of the invention.

FIG. 6 illustrates, in cross-section, an example of a complementary bipolar integrated circuit according to this embodiment of the invention, in which a masked carbon-bearing implant is applied to selectively inhibit diffusion of dopant from buried collector layers, while permitting such updiffusion in other locations. In the integrated circuit of FIG. 6, PNP transistor 50$p$ and NPN transistor 50$n$ are shown. PNP transistor 50$p$ is constructed in the manner described above relative to FIGS. 5a through 5c. NPN transistor 50$n$ is constructed similarly as PNP transistor 50$p$, but of course with the opposite conductivity type.

Transistors 50$p$, 50$n$ therefore have respective buried collector regions 26'$p$, 26'$n$, that consist of heavily doped portions of a silicon thin-film layer, each providing a low resistance path to the respective collector contacts 44$c$. In this embodiment of the invention, buried collector region 26'$n$ is heavily-doped with phosphorous or antimony, while buried collector region 26'$p$ is boron-doped, as described above. As in the previously described examples, the doping of buried collector regions 26' is performed by respective masked ion implant processes and subsequent anneals. The updiffusion of dopant from buried collector regions 26'$n$, 26'$p$ is inhibited, at locations underlying the eventual emitter region, by way of a masked ion implant of a carbon-bearing species, as described above relative to FIGS. 5a and 5b. It is contemplated that a single masked implant of the carbon-bearing species may be performed for both the NPN and PNP devices. In each of transistors 50$p$, 50$n$, however, those portions of the buried collector regions 26'$p$, 26'$n$ at which collector contacts are to be formed are protected from this implant according to this embodiment of the invention. As a result, subsequent processing, including the epitaxial growth of layer 28, results in diffusion of the phosphorous or antimony dopant from buried collector layer 26'$n$ in NPN transistor 50$n$, and diffusion of boron dopant from buried collector layer 26'$p$ in PNP transistor 50$p$, forming heavily-doped regions 55$n$, 55$p$, respectively, to which collector contacts are made, as shown in FIG. 6.

In this complementary bipolar realization, therefore, selective masked carbon-bearing species ion implantation provides good matching of the PNP and NPN devices to one another, without the differences that arise in conventional complementary devices due to the differential updiffusion of dopant from buried collector layers depending upon the dopant species. This matching is accomplished in this embodiment of the invention because the updiffusion in these "safe" areas facilitates the formation of collector contacts to the buried collector layers.

Figure 7A:
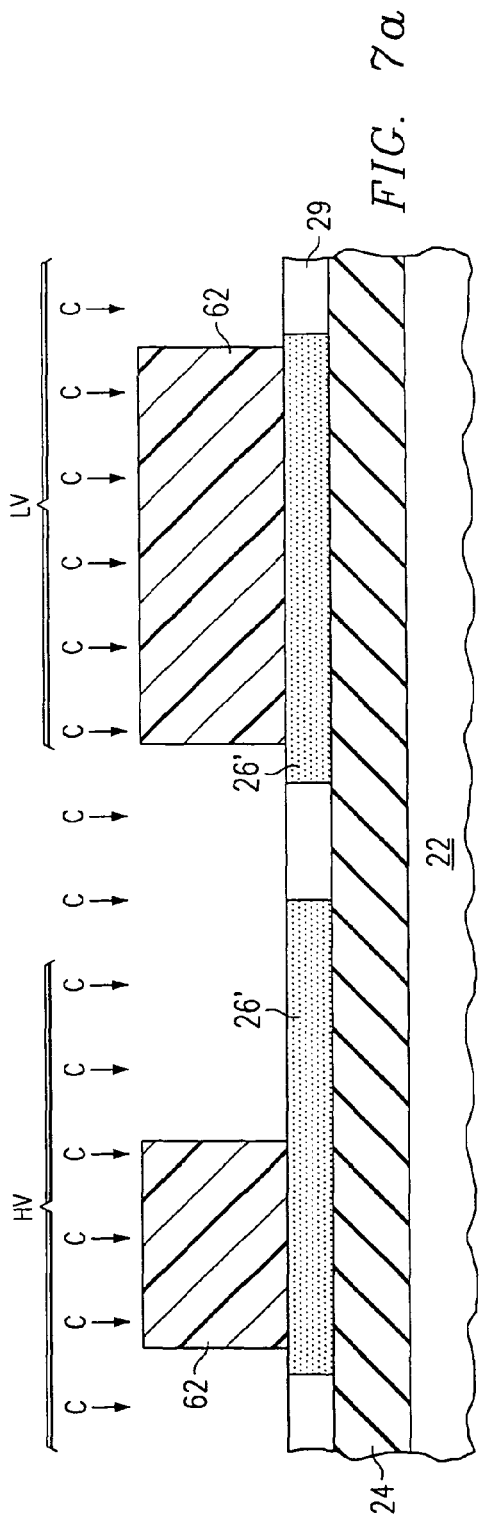
FIGS. 7a and 7b are cross-sectional diagrams of the construction of bipolar transistors according to a third preferred embodiment of the invention.
Figure 7B:
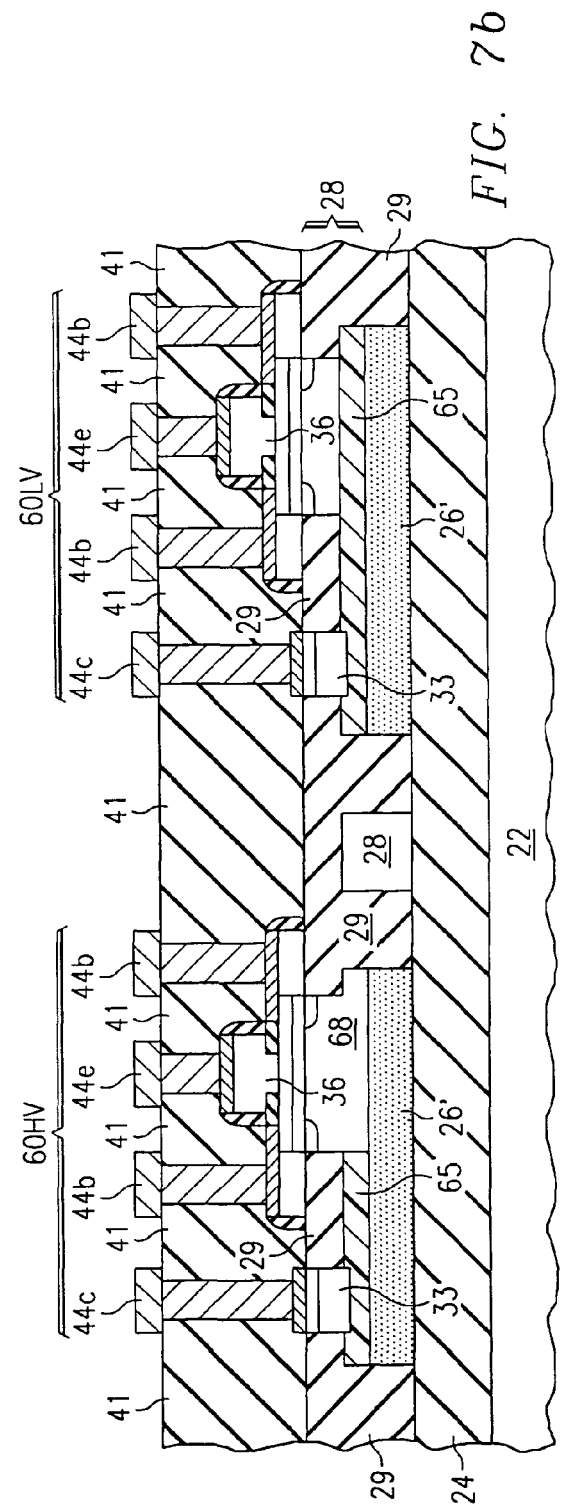

The concept of the masked implant of the carbon-bearing species may also be used to advantage in the formation of transistors of different electrical and performance characteristics, as will now be described relative to another alternative embodiment of the invention, relative to FIGS. 7a and 7b. In the example of FIGS. 7a and 7b, the construction of PNP transistors 60HV and 60LV will be described, it being understood that this embodiment of the invention may also be directly applied to the fabrication of NPN transistors, as well.

As shown in FIG. 7a, high voltage region HV and low voltage LV each have a buried collector region 26' formed within a thin film silicon layer 26, by way of ion implantation as described above. Implant mask 62 is formed over the surface of thin film silicon layer 26 to expose selected locations of thin film silicon layer 26 to receive ion implantation of a carbon-bearing species. Implant mask 62 may be formed of photolithographically patterned photoresist of adequate thickness to stop the implant, or alternatively by way of a hard mask, such as formed of silicon dioxide that is photolithographically patterned and etched. In this embodiment of the invention, mask layer 62 protects one portion of buried collector region 26' in high voltage region HV, but exposes another portion of region 26'. In contrast, in low voltage region LV, mask layer 62 covers almost the entirety of buried collector region 26', except perhaps at the edges (to inhibit lateral diffusion of dopant). Ion implantation of a carbon-bearing species, such as elemental carbon or alternatively SiGeC, is then performed, as suggested by FIG. 7a. According to this embodiment of the invention, therefore, the carbon-bearing species is implanted into the buried collector region 26' of the high voltage region HV, and will inhibit updiffusion of the (boron) dopant into a subsequently formed epitaxial layer at that implanted location. This updiffusion is not inhibited in low voltage region LV, as no implant reaches buried collector region 26' in that region.

FIG. 7b shows, in cross-section, completed transistors 60HV, 60LV, the construction of which is performed in similar manner as described above relative to FIGS. 2e through 2g, and FIG. 5c. In summary, silicon is epitaxially grown (in the absence of a diffusion-retarding dopant) to form an epitaxial silicon layer 28 of the desired thickness over silicon thin-film layer 26, 26'. As before, the doping concentration of epitaxial layer 28 may be set during epitaxy, or alternatively a subsequent doping process may be carried out. Trench isolation structures 29 are formed at the appropriate locations of epitaxial layer 28 and silicon thin film layer 26. Transistors 60HV, 60LV then are completed as before, resulting in the structure shown in FIG. 7b, with the same reference numerals as used before referring to the same structures if present in transistors 60HV, 60LV.

As shown in FIG. 7b, the masked carbon-bearing species implant according to this embodiment of the invention inhibits diffusion of dopant from buried collector region 26' at the location underlying emitter electrode 36 in transistor 60HV, leaving a relatively lightly-doped subcollector 68 for this transistor 60HV. On the other hand, because no such implant was applied to virtually the entirety of buried collector region 26' of eventual transistor 60LV, dopant from its buried collector region 26' diffuses upwardly into epitaxial layer 28 during its formation, and during other high temperature processes, forming a heavily doped region 65 within the collector of transistor 60LV. A similar heavily doped region 65 is formed in transistor 60HV, away from the active region of the device and located near the location of its collector sinker structure 33. Locations 65 of course correspond to the portions of buried collector layer 26' that were protected by mask layer 62 from the carbon-bearing species implant, and therefore there is substantially no barrier to updiffusion at these locations.

The selective inhibition of dopant diffusion near the active emitter regions provide a differential performance characteristic for transistors 60HV, 60LV in this embodiment of the invention, even where transistors 60HV, 60LV are otherwise similarly constructed. Subcollector 68 of transistor 60HV is relatively thick, because of the carbon-bearing species implant that inhibits diffusion, and yields a high breakdown voltage for this device, rendering it suitable for use in high bias voltage applications. This high breakdown voltage comes at a cost of relatively high collector series resistance, however, because of the distance that current must travel through thick subcollector 68. Even in transistor 60HV, however, the masking of implant from portions of buried collector region 26' at which collector sinker structure 33 is to be formed facilitates the making of a good, low resistance, collector contact away from the active region of the device.

On the other hand, because heavily doped regions 65 are formed by the updiffusion of dopant from buried collector region 26' in transistor 60LV, the distance between the active region of the device and heavily doped region 65 (i.e., the thickness of its subcollector) is much shorter. Accordingly, transistor 60LV has a lower breakdown voltage than does transistor 60HV; however, this shorter distance of the current path before reaching heavily doped region 65 yields a lower series collector resistance for transistor 60LV. Transistor 60LV is therefore more suitable for high performance and high speed applications in which the bias voltages can be kept low.

According to each of the embodiments of this invention, as described above, numerous advantages are provided. The ability to control the diffusion of dopant from heavily doped buried layers, such as buried collectors in bipolar devices, provided by this invention permits improved control in the determination of the operating characteristics of these devices, and improved matching of device characteristics, especially in the complementary bipolar context. Pressure on the thermal budget arising from the problem of diffusion from buried layers is also relieved. Selective application of the diffusion retardant permits further control in the relative diffusion of dopant from buried layers also permits design flexibility in the fabrication of different transistors in the same integrated circuit, both in the context of complementary bipolar devices and also in the context of transistors having different tradeoffs between breakdown voltage and collector resistance.

Figure 8A:
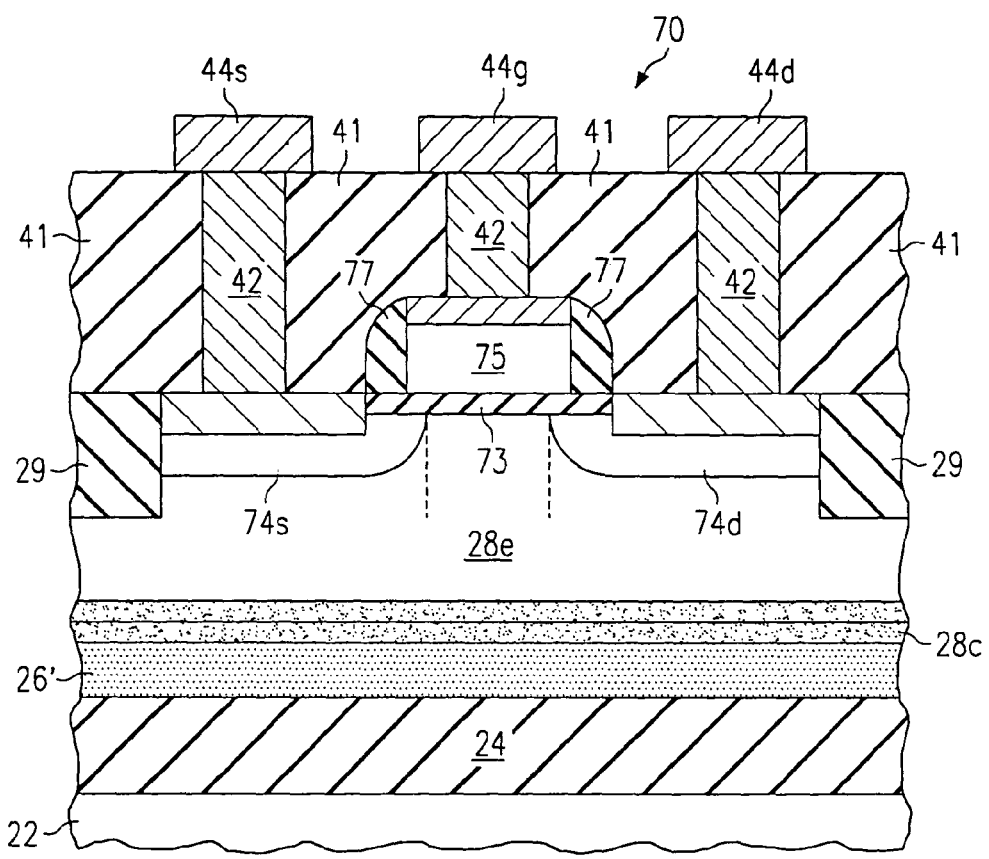
FIGS. 8a and 8b are cross-sectional diagrams of the construction of metal-oxide-semiconductor transistors according to the preferred embodiments of the invention.
Figure 8B:
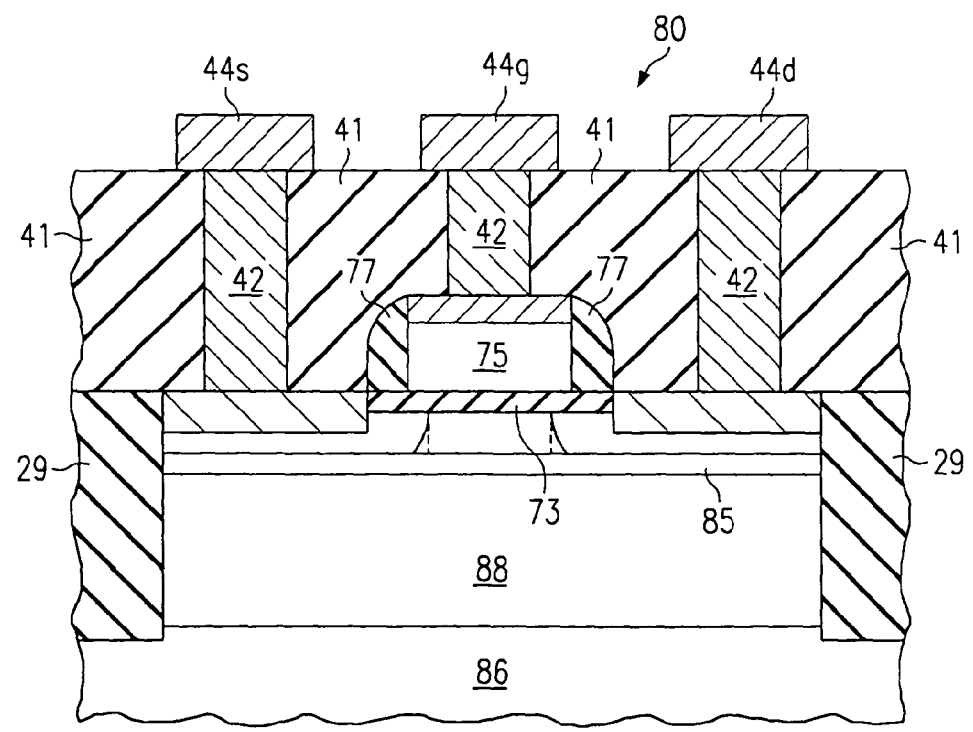

It is also contemplated that the present invention may also be of benefit when applied to metal-oxide-semiconductor (MOS) transistors, either in a purely MOS integrated circuit, or in an integrated circuit that includes both bipolar and MOS devices (such as BiCMOS or CBiCMOS devices). FIGS. 8*a* and 8*b* illustrate examples of embodiments of this invention as used in connection with MOS devices.

FIG. 8*a* is a cross-sectional diagram of n-channel MOS transistor 70. Transistor 70 in this example can be formed in the same integrated circuit as PNP transistor 30 of FIG. 2*g*; similar structures are referred to with the same reference numerals as in FIG. 2*g* and the other drawings discussed above. In this example, therefore, transistor 70 is formed in a silicon layer that overlies buried insulator 24, supported by handle wafer 22. This silicon layer includes the silicon layers 26, 28 to which reference is made relative to FIGS. 2*a* through 2*g* above. The active elements of transistor 70 include gate electrode 75, which overlies p-well 28*e* and is separated therefrom by gate oxide 73. On either side of the channel underlying gate electrode 35, are source region 74*s* and drain region 74*d*. According to this embodiment of the invention, source and drain regions 74*s*, 74*d* are n-type doped regions formed by ion implantation in the conventional self-aligned manner relative to gate electrode 75 and its sidewall spacers 77. Source and drain regions 74*s*, 74*d*, and gate electrode 75, may be silicide-clad as shown, if desired. Electrical contact to source and drain regions 74*s*, 74*d* and gate electrode 75 may be made by way of corresponding plugs 42 through overlying insulator layer 41, with metallization connections 44*s*, 44*d*, 44*g* in contact with the corresponding plugs 42.

It is contemplated that many of the elements of transistor 70 may be made simultaneously with elements of bipolar transistor 20 described above. For example, plugs 42 in both transistors may be formed simultaneously. Emitter electrode 35 and gate electrode 75 may also be formed from the same polysilicon layer, with the difference that emitter electrode 35 is in contact with base layer 32 while gate electrode 75 is insulated from the underlying silicon. Additionally, p-well 28*e* is effectively the same silicon layer as subcollector 28*e* in bipolar transistor 20, and therefore is similarly doped and formed by way of epitaxy.

According to this embodiment of the invention, p-type buried collector region 26' also resides under n-channel MOS transistor 70. While, in this MOS case, no transistor current is intended to be conducted by buried region 26', the presence of a conductive ground plane beneath the channel region of an MOS device has been found to be beneficial. Such a ground plan ensures the proper body node bias, by providing a low-resistance body contact to a location that is directly in contact with the body node under the channel region. In addition, the ground plane provided by buried region 26' also effects good shielding of the MOS device from noise generated elsewhere in the integrated circuit.

Also in this embodiment of the invention, diffusion barrier 28*c* is present in transistor 70, overlying buried region 26'. Diffusion barrier 28*c* is formed in the same manner, and at the same time, as for any bipolar devices in the same integrated circuit with transistor 70, either by way of a carbon-bearing source during epitaxy of p-well 28*e*, or by way of a blanket or masked ion implantation. The presence of the carbon in diffusion barrier 28*c* confines the dopant of buried region 26', which in this case is boron, from updiffusing toward the channel of transistor 70. As a result, buried region 26' serves as a conductive ground plane, and can be placed at a controlled depth below source and drain regions 26'. The tradeoff between leakage current and breakdown voltage, on the one hand, and proximity of buried region 26' to the channel, on the other hand, can therefore be closely controlled according to this embodiment of the invention.

According to another embodiment of the invention, which is specifically directed to MOS transistors, the carbon-bearing diffusion barrier layer can be placed extremely close to the active regions of the device, as will now be described relative to transistor 80 of FIG. 8*b*. In FIG. 8*b*, the same elements as shown in FIG. 8*a* will be referred to by the same reference numerals.

Transistor 80 is an n-channel transistor, in which gate electrode 75 and the overlying connections thereto, and to the source and drain, are identical to that in the case of transistor 70 described above. According to this embodiment of the invention, however, transistor 80 is formed at a surface of p-well 86, which is a lightly-doped p-type region; p-well 86 may be an implanted diffused region of a bulk silicon wafer, a region in a silicon-on-insulator (SOI) device as described above, or further in the alternative may simply be the substrate on which the entire integrated circuit is formed. Super steep retrograde well 88 overlies p-well 86, in a manner that is confined between isolation structures 20. According to this embodiment of the invention, retrograde well 88 is also a p-type region, but has a super-steep retrograde dopant profile, in which the dopant concentration in well 88 increases steeply with increasing depth into the wafer. As is known in the art, retrograde wells such as well 88 are useful in improving electrical isolation among transistors in the same substrate.

According to this embodiment of the invention, diffusion barrier 85 is disposed at the surface of retrograde well 88. Diffusion barrier 85 is formed in the manner described above, either by way of including a carbon source during epitaxial growth of silicon or by way of a blanket or masked ion implantation. In this example, diffusion barrier 85 is extremely close to the surface of the structure, and in fact is within the region at which the source and drain junctions would otherwise extend so that the source and drain regions actually abut diffusion barrier 85 as shown in FIG. 8b. Diffusion barrier 85 in this embodiment therefore provides a barrier both to updiffusion from the super steep retrograde profile of well 88, and also to the diffusion of implanted source/drain dopant. As a result, the excellent isolation characteristics provided by super steep retrograde well 88 are maintained without adversely affecting the leakage current or breakdown characteristics of transistor 80. In addition, the depth to which the n-type source/drain dopant (typically phosphorous) diffuses to form the source/drain junctions is kept shallow, as is beneficial for high performance transistors. This reduction in junction depth is achieved while still permitting the lateral diffusion of the source/drain dopant under sidewall spacers 77, so that transistor 80 can turn on in response to the appropriate gate voltage. It is therefore contemplated that transistor 80 will be of particular benefit in high performance MOS transistors.

According to these additional embodiments of the invention relative to MOS transistors, the benefits of diffusion barriers in the underlying single-crystal silicon include improved process control, and less pressure on thermal budget, as achieved with the bipolar transistors described above. In some cases, the present invention can result in improved device performance, as well.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A method of fabricating an integrated circuit including a vertical bipolar transistor, comprising:
   providing a silicon-on-insulator substrate including a silicon thin film layer disposed over a buried oxide layer;
   selectively implanting the silicon thin film layer with boron to form a relatively heavily doped p-type buried collector region;
   forming an epitaxial silicon layer with a relatively lightly doped p-type subcollector region over the silicon thin film layer including over the buried collector region, by first growing a diffusion barrier over the silicon thin film layer through epitaxial growth of silicon in the presence of a source of carbon or silicon-germanium-carbon, and then continuing the epitaxial growth of silicon to define the subcollector region over the diffusion barrier in the absence of the source of carbon or silicon-germanium-carbon;
   forming a deep trench isolation structure in the epitaxial silicon layer and the silicon thin film layer, down to the buried oxide layer, to surround and isolate a surface region of the epitaxial silicon layer located over the buried collector region;
   forming a shallow trench isolation structure in the surrounded surface region in the subcollector region of epitaxial silicon layer, down to a depth less than the depth of the diffusion barrier, to provide first and second isolated surface portions in the surrounded surface region;
   selectively implanting the first isolated surface portion with p-type dopant to form a relatively heavily doped p-type collector sinker structure;
   forming an n-type doped silicon or silicon-germanium epitaxial layer disposed at the second isolated surface portion to define an intrinsic base region; and
   forming a relatively heavily doped p-type polysilicon structure over the silicon-germanium epitaxial layer to define an extrinsic emitter.

2. The method of claim 1, wherein the concentration of carbon in the diffusion barrier layer is 0.1% atomic weight.

3. The method of claim 1, further comprising:
   defining a region without carbon over the diffusion barrier region; and
   doping the region without carbon over the diffusion region with dopant material of the same n-type or p-type as the dopant material used to dope a layer of semiconductor material provided to the substrate, to define the relatively lightly doped subcollector portion with the same corresponding n-type or p-type doping as the collector region.

4. The method of claim 1,
   whereby the diffusion barrier region serves to block diffusion of boron from the buried collector region to the subcollector region.

* * * * *